(12) United States Patent
Ilango et al.

(10) Patent No.: US 10,715,039 B1
(45) Date of Patent: Jul. 14, 2020

(54) PEAK CURRENT CONTROLLED SWITCH MODE POWER SUPPLY WITH EMBEDDED ADAPTIVE PULSE FREQUENCY MODULATION CONTROL

(71) Applicant: Cirrus Logic International Semiconductor Ltd., Edinburgh (GB)

(72) Inventors: Anand Ilango, Austin, TX (US); Mikel Ash, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/294,581

(22) Filed: Mar. 6, 2019

Related U.S. Application Data

(60) Provisional application No. 62/639,655, filed on Mar. 7, 2018.

(51) Int. Cl.
*H02M 3/156* (2006.01)
*G01R 19/175* (2006.01)
*H02M 1/00* (2006.01)

(52) U.S. Cl.
CPC .......... *H02M 3/156* (2013.01); *G01R 19/175* (2013.01); *H02M 2001/0009* (2013.01); *H02M 2001/0025* (2013.01)

(58) Field of Classification Search
CPC ......... H02M 3/156; H02M 2001/0009; H02M 2001/0025; G01R 19/175
See application file for complete search history.

(56) References Cited

U.S. PATENT DOCUMENTS

2013/0154598 A1* 6/2013 Yu ........................... G05F 1/618
323/285

* cited by examiner

*Primary Examiner* — Jue Zhang
(74) *Attorney, Agent, or Firm* — Jackson Walker L.L.P.

(57) ABSTRACT

A method for controlling a current mode switch mode power supply may include detecting a peak inductor current of a power inductor of the current mode switch mode power supply, estimating a load current based on a variable of a main control loop of the current mode switch mode power supply, detecting, within a main control loop of the current mode switch mode power supply, whether the load current is lower in magnitude than an estimated boundary condition current threshold, the estimated boundary condition current threshold defining a crossover threshold between operation of the current mode switch mode power supply in a continuous conduction mode and operation of the current mode switch mode power supply in a discontinuous conduction mode, and responsive to the load current being lower in magnitude than the estimated boundary condition current, causing pulse skipping of an output signal of the current mode switch mode power supply on an immediately subsequent switching cycle of the current mode switch mode power supply.

18 Claims, 3 Drawing Sheets

PEAK CURRENT CONTROLLED SWITCH MODE POWER SUPPLY WITH EMBEDDED ADAPTIVE PULSE FREQUENCY MODULATION CONTROL

RELATED APPLICATION

The present disclosure claims priority to U.S. Provisional Patent Application Ser. No. 62/639,655, filed Mar. 7, 2018, which is incorporated by reference herein in its entirety.

FIELD OF DISCLOSURE

The present disclosure relates in general to circuits for audio devices, including without limitation personal audio devices such as wireless telephones and media players, and more specifically, to a switch mode power supply with embedded adaptive pulse frequency modulation control in order to achieve low power operation.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers. Oftentimes, a power converter may be used to provide a supply voltage to a power amplifier in order to amplify a signal driven to speakers, headphones, or other transducers. A switching power converter is a type of electronic circuit that converts a source of power from one direct current (DC) voltage level to another DC voltage level. Examples of such switching DC-DC converters include but are not limited to a boost converter, a buck converter, a buck-boost converter, an inverting buck-boost converter, and other types of switching DC-DC converters. Thus, using a power converter, a DC voltage such as that provided by a battery may be converted to another DC voltage used to power the power amplifier. In addition, in some applications, a power converter may be implemented to provide electrical energy to a core analog and digital circuits of an audio processing integrated circuit. A power converter used in such a fashion may be referred to as a switch mode power supply.

A peak current controlled switch mode power supply operating in continuous conduction mode (CCM) may incur excessive power loss that significantly degrades efficiency under light load conditions. To achieve improved power efficiency across wide load current and input voltage ranges, traditional switch mode power supplies may transition between discontinuous conduction mode (DCM) and CCM and vice versa. However, excessive power loss in DCM operation becomes significant as switching frequency increases. Accordingly, this issue has been addressed by further employing pulse-skipping or pulse-frequency modulation (PFM) in lieu of DCM operation, which eliminates negative inductor current losses and reduction of switching losses through reduction of switching frequency. Existing techniques to provide PFM control in switch mode power supplies employ multiplexing between two control loops: a linear feedback and hysteretic PFM feedback control loop, in order to drive the power converter while regulating output voltage. However, such multiplexed approach complicates design and increases costs and time to market from a design and test perspective.

SUMMARY

In accordance with the teachings of the present disclosure, one or more disadvantages and problems associated with existing approaches to operating a switch mode power converter may be reduced or eliminated.

In accordance with embodiments of the present disclosure, a method for controlling a current mode switch mode power supply may include detecting a peak inductor current of a power inductor of the current mode switch mode power supply, estimating a load current based on a variable of a main control loop of the current mode switch mode power supply, detecting, within a main control loop of the current mode switch mode power supply, whether the load current is lower in magnitude than an estimated boundary condition current threshold, the estimated boundary condition current threshold defining a crossover threshold between operation of the current mode switch mode power supply in a continuous conduction mode and operation of the current mode switch mode power supply in a discontinuous conduction mode, and responsive to the load current being lower in magnitude than the estimated boundary condition current, causing pulse skipping of an output signal of the current mode switch mode power supply on an immediately subsequent switching cycle of the current mode switch mode power supply.

In accordance with these and other embodiments of the present disclosure, a system for controlling a current mode switch mode power supply may include a peak detector configured to detect a peak inductor current of a power inductor of the current mode switch mode power supply and control circuitry configured to estimate a load current based on a variable of a main control loop of the current mode switch mode power supply, detect, within a main control loop of the current mode switch mode power supply, whether the load current is lower in magnitude than an estimated boundary condition current threshold, the estimated boundary condition current threshold defining a crossover threshold between operation of the current mode switch mode power supply in a continuous conduction mode and operation of the current mode switch mode power supply in a discontinuous conduction mode, and responsive to the load current being lower in magnitude than the estimated boundary condition current, cause pulse skipping of an output signal of the current mode switch mode power supply on an immediately subsequent switching cycle of the current mode switch mode power supply.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
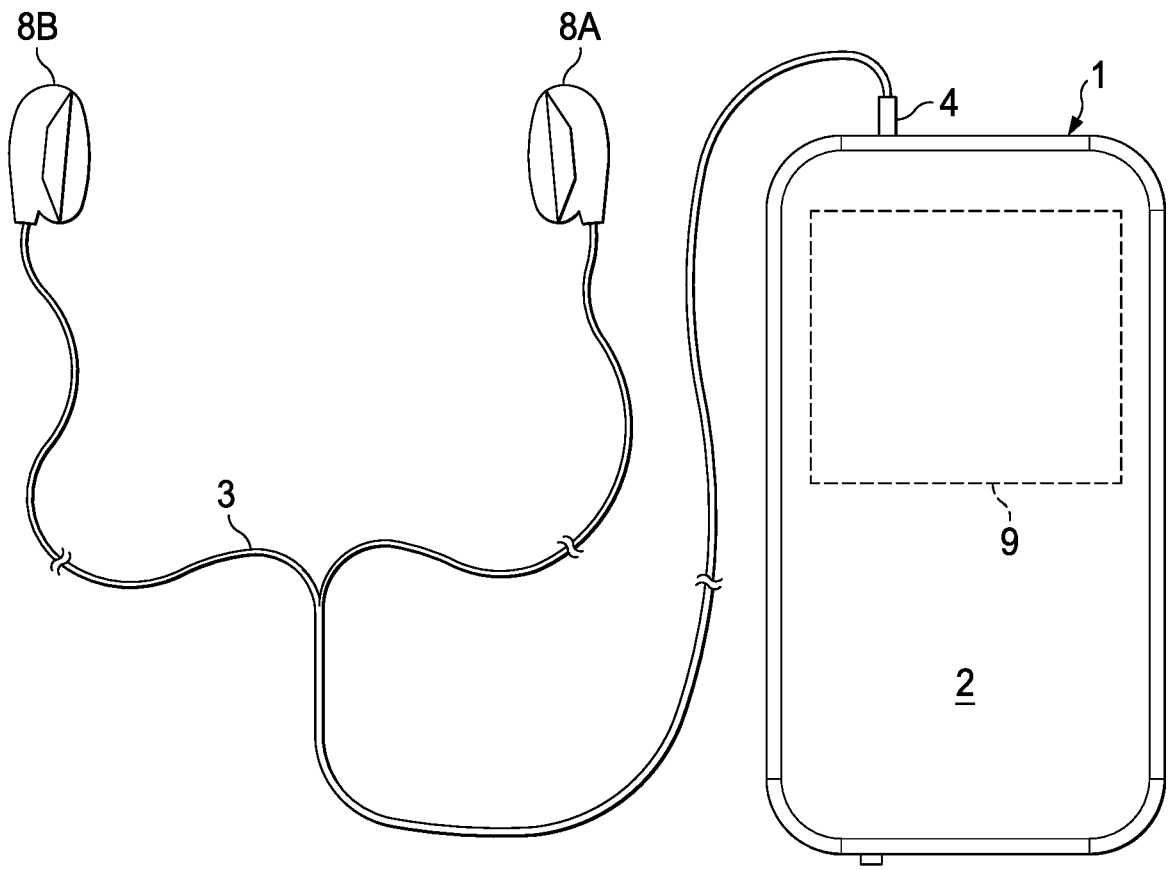
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
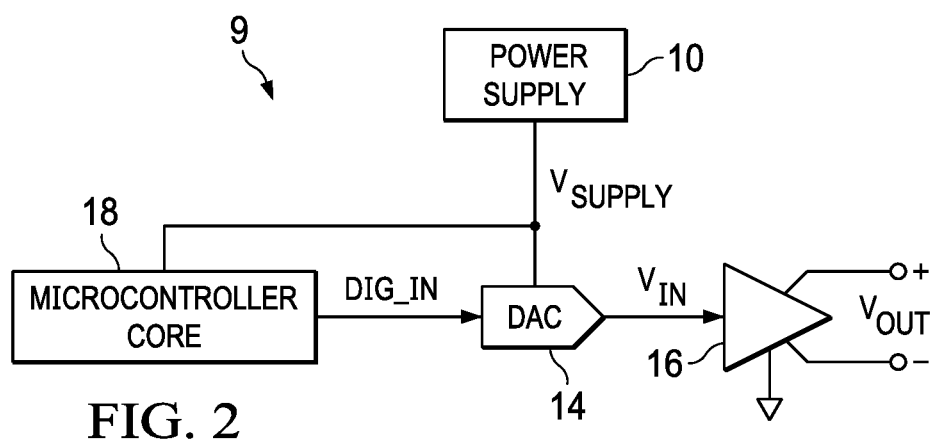
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier 16 which may amplify or attenuate audio input signal $V_{IN}$ to provide a differential audio output signal $V_{OUT}$, which may operate a speaker, a headphone transducer, a line level signal output, and/or other suitable output. In some embodiments, DAC 14 may be an integral component of amplifier 16. A power supply 10 may provide the power supply rail inputs of microcontroller core 18, DAC 14, and/or other components of audio IC 9. In some embodiments, power supply 10 may comprise a switched-mode power converter, as described in greater detail below. Although FIGS. 1 and 2 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 3:
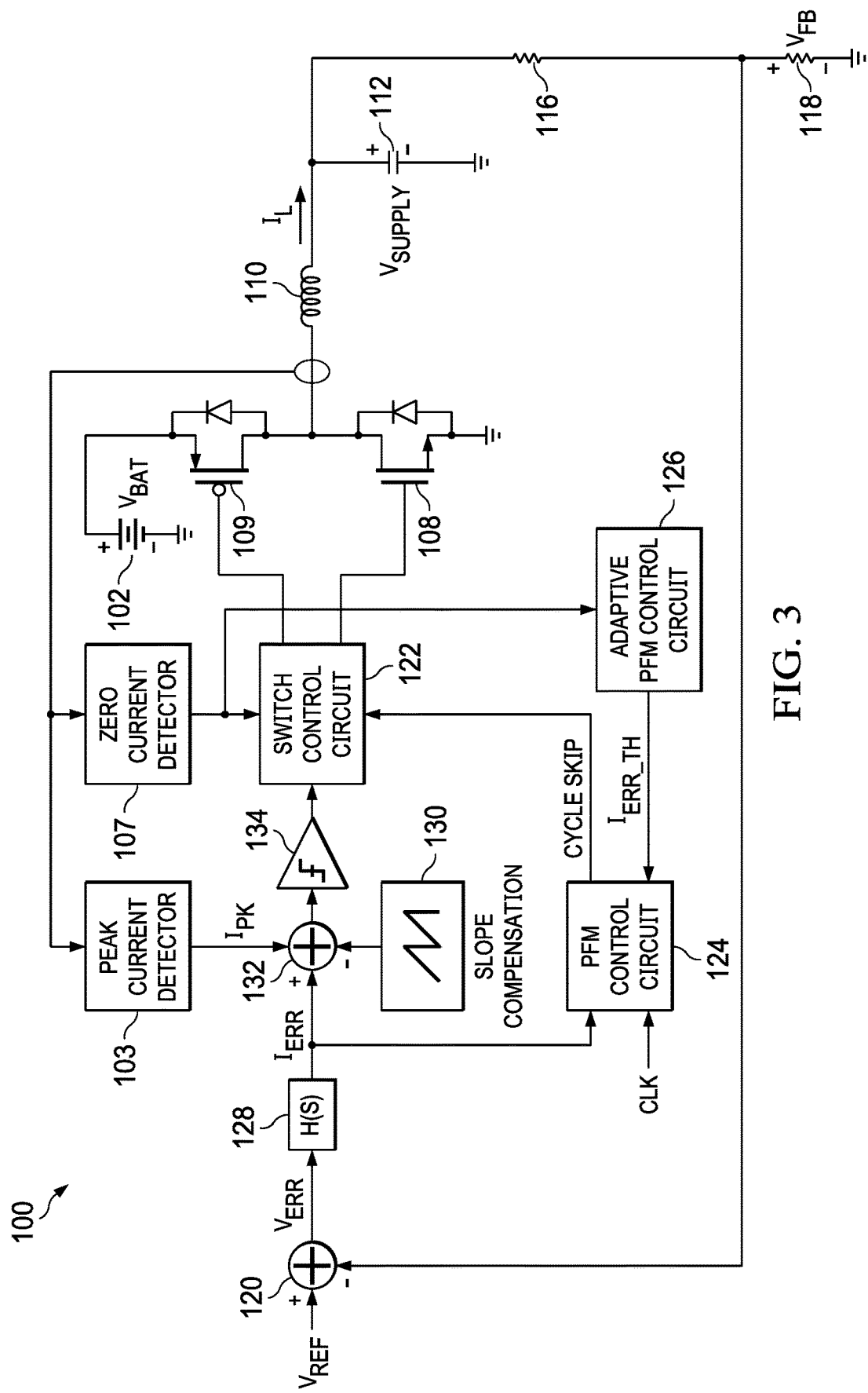
FIG. 3 illustrates a block diagram of selected components of an example peak-current control buck converter which may be used to implement one or both of the power supplies shown in FIG. 2, in accordance with embodiments of the present disclosure.
Figure 4:
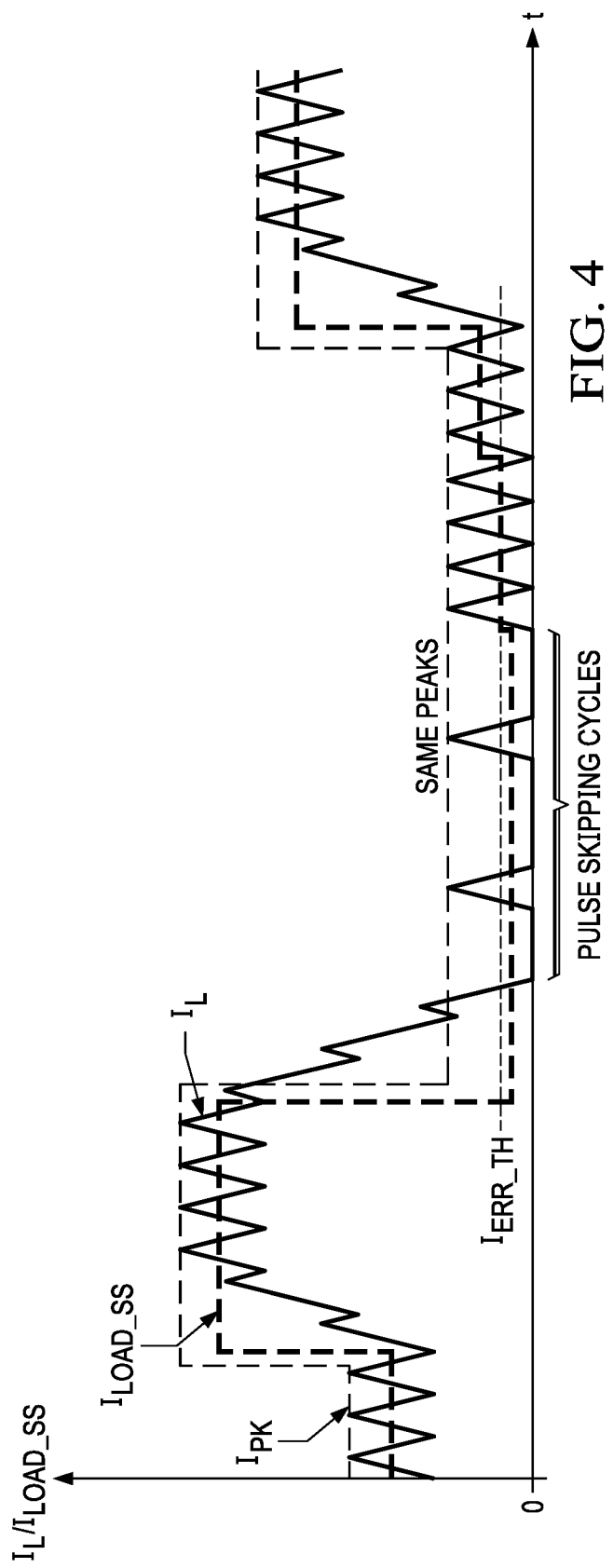
FIG. 4 illustrates graphs depicting example waveforms of inductor current versus time for the power converter of FIG. 3, in accordance with embodiments of the present disclosure.

FIG. 3 illustrates a block diagram of selected components of an example peak-current control buck converter 100, which may be referred to as a switch mode power supply, and which may be used to implement power supply 10 shown in FIG. 2, in accordance with embodiments of the present disclosure. As shown in FIG. 3, buck converter 100 may include a battery 102, a power inductor 110, a switch 108 implemented as an n-type metal-oxide-semiconductor field-effect transistor (NFET), a switch 109 implemented as a p-type metal-oxide-semiconductor field-effect transistor (PFET), a peak current detector 103, a zero current detector 107, a buck capacitor 112, switch control circuit 122, a pulse-frequency modulation (PFM) control circuit 124, an adaptive PFM control circuit 126, feedback resistors 116 and 118, voltage-to-current converter 128, slope compensation circuity 130, summing blocks 120 and 132, and comparator 134. FIG. 4 illustrates operation of buck converter 100 as a function of an average load current associated with buck converter 100.

Switch control circuit 122 may comprise any system, device, or apparatus configured to control switching of switch 108 and switch 109 based on an error feedback control signal $I_{ERR}$, peak inductor current $I_{PK}$, a slope compensation correction signal, and a control signal CYCLE SKIP generated by PFM control circuit 124, in order to perform peak current control of buck converter 100.

To illustrate, in a first phase of a switching cycle of buck converter 100, switch control circuit 122 may cause switch 109 to be activated (e.g., closed, turned on, enabled) and switch 108 to be deactivated (e.g., opened, turned off, disabled). Thus, during the first phase, an inductor current $I_L$ flowing in power inductor 110 may increase during the first phase as power inductor 110 charges into buck capacitor 112.

At the point in time when measured inductor current $I_L$ reaches a peak inductor current $I_{PK}$, switch control circuit 122 may cause switch 109 to be deactivated and switch 108 to be activated, such that buck converter 100 enters a second phase of the switching cycle. As a result, inductor current $I_L$ may decrease during the second phase as buck capacitor 112 discharges through feedback resistors 116 and 118. The second phase may continue until the end of the switching cycle, after which the first phase again occurs.

In operation, the duty cycle of switch 108 (e.g., the duration of the first phase) may determine the magnitude of supply voltage $V_{SUPPLY}$ relative to battery voltage $V_{BAT}$. Thus, for a desired level of supply voltage $V_{SUPPLY}$, buck converter 100 may implement a feedback control loop as described in greater detail below. In order to control switches 108 and 109, switch control circuit 122 may output one or more pulse-width modulated control signals to switches 108 and 109 to control their respective duty cycles.

To further illustrate, an error feedback control signal $I_{ERR}$ may be measured by determining a voltage error $V_{ERR}$ calculated by subtracting feedback voltage $V_{FB}$ across feedback resistor 118 from reference voltage $V_{REF}$ with combiner 120, and converting such voltage error $V_{ERR}$ into an equivalent error feedback control signal $I_{ERR}$ using voltage-to-current converter 128.

In addition, slope compensation circuitry 130 may generate a slope compensation signal. In some embodiments, slope compensation circuitry 130 may generate the slope compensation signal as a triangle or sawtooth waveform. The slope compensation signal may in effect be combined with peak current signal $I_{PK}$ to generate slope-compensated peak current signal by combiner 132. Thus, together combiner 132 and comparator 134 may, during the first phase of buck converter 100, compare error feedback control signal $I_{ERR}$ (e.g., derived from and indicative of inductor current $I_L$), generating a control signal responsive to the comparison. Thus, based on the control signal generated by comparator 134 (and control signal CYCLE SKIP, as discussed below), switch control circuit 122 may in turn generate appropriate control signals to switches 108 and 109 to accordingly selectively activate and deactivate switches 108 and 109.

PFM control circuit 124 may include any system, device, or apparatus configured to control pulse-frequency modulation of buck converter 100 in order to accommodate low-power operation of buck converter 100 while also avoiding operation in a discontinuous conduction mode of buck converter 100, as described in greater detail below. In addition, as shown in FIG. 3, PFM control circuit 124 may be embedded within the standard linear feedback control loop of buck converter 100 (e.g., control is based on error feedback control signal $I_{ERR}$ calculated in the main feedback control loop of buck converter 100), thus avoiding the need to multiplex between multiple feedback control loops, as is done in traditional approaches.

Because buck converter 100 is a peak current controlled regulator, operation of buck converter 100 and control thereof may be based on a known relationship among peak inductor current $I_{PK}$, a steady-state (or average) load current $I_{LOAD\_SS}$ flowing through feedback resistor 116, and an error feedback control signal $I_{ERR}$ based on steady-state load current $I_{LOAD\_SS}$ and a reference current represented by a reference voltage $V_{REF}$. At the CCM/DCM boundary of operation of buck converter 100, peak inductor current $I_{PK}$ may be given as:

$$I_{PK} = 2I_{LOAD\_SS} = \frac{V_{BAT} - V_{SUPPLY}}{LF_{sw}}D$$

where L is the inductance of power inductor 110, $F_{sw}$ is the switching frequency of buck converter 100, and D is the duty cycle of buck converter 100. As shown above, steady-state load current $I_{LOAD\_SS}$ may be estimated as one-half of peak inductor current $I_{PK}$.

The relationship between error feedback control signal $I_{ERR}$ and peak inductor current $I_{PK}$ may be given by:

$$I_{PK} = SI_{ERR}$$

where S is a constant scaling factor. Thus, error feedback control signal $I_{ERR}$ may be estimated based on peak inductor current $I_{PK}$, and error feedback control signal $I_{ERR}$ may be a function of steady-state load current $I_{LOAD\_SS}$, thus meaning that steady-state load current $I_{LOAD\_SS}$ and error feedback control signal $I_{ERR}$ may be estimated from peak inductor current $I_{PK}$.

Accordingly, to perform pulse-frequency modulation control of buck converter 100, PFM control circuit 124 may monitor error feedback control signal $I_{ERR}$ and detect whether monitor error feedback control signal $I_{ERR}$ has crossed a threshold representing a boundary condition between operation in CCM and operation in DCM, and if the threshold is crossed, communicates a control signal CYCLE SKIP to switch control circuit 122 to cause switch control circuit 122 to skip the next switching cycle of buck converter 100 (e.g., by deactivating both switches 108 and 109 during the skipped cycle). Combining equations above, such threshold level $I_{ERR\_TH}$ may be given by:

$$I_{ERR\_TH} = \frac{V_{BAT} - V_{SUPPLY}}{SLF_{sw}}D$$

To further illustrate, reference is made to FIG. 4, which depicts skipping of a switching cycles of buck converter 100 subsequent to detection of error feedback control signal $I_{ERR}$ falling below threshold level $I_{ERR\_TH}$.

Because of variations in terms that set such threshold level $I_{ERR\_TH}$, PFM control circuit 124 may cause initiation of pulse skipping PFM operation before the load of buck converter 100 truly crosses the boundary condition between operation in CCM and operation in DCM or after it has crossed into DCM operation. Either condition may be undesirable as either may cause poor PFM ripple performance and/or non-optimal efficiency performance To resolve this issue, adaptive PFM control circuit 126 may adaptively adjust threshold level $I_{ERR\_TH}$ used by PFM control circuit 124 as a reference for comparison to the measured error feedback control signal $I_{ERR}$ based on zero crossings of power inductor current $I_L$ as sensed by zero current detector 107.

In operation, during CCM operation, adaptive PFM control circuit 126 may count a number of zero crossings of power inductor current $I_L$ as sensed by zero current detector 107 and compare the number of zero crossings occurring before PFM control circuit 124 causes pulse skipping to a zero crossing threshold. In some embodiments, the zero crossing threshold may ideally be one. If the number of zero crossings occurring before PFM control circuit 124 causes pulse skipping is greater than the zero crossing threshold, then threshold level $I_{ERR\_TH}$ may be too low, and adaptive PFM control circuit 126 may increase threshold level $I_{ERR\_TH}$ (e.g., if represented digitally, incremented by one quantization level of the digital representation for threshold level $I_{ERR\_TH}$). On the other hand, if the number of zero crossings occurring before PFM control circuit 124 causes pulse skipping is lesser than the zero crossing threshold, then threshold level $I_{ERR\_TH}$ may be too high, and adaptive PFM control circuit 126 may decrease threshold level $I_{ERR\_TH}$ (e.g., if represented digitally, decremented by one quantization level of the digital representation for threshold level $I_{ERR\_TH}$). In the event that the number of zero crossings occurring before PFM control circuit 124 causes pulse skipping is equal to the zero crossing threshold, then threshold level $I_{ERR\_TH}$ may be at an appropriate level, and adaptive PFM control circuit 126 may leave threshold level $I_{ERR\_TH}$ unchanged. In some embodiments, if the number of zero crossings occurring before PFM control circuit 124 causes pulse skipping exceeds a higher second zero crossing threshold (e.g., 15), adaptive PFM control circuit 126 may rapidly increase threshold level $I_{ERR\_TH}$ until a pulse skip is initiated, and then may adjust threshold level $I_{ERR\_TH}$ incrementally thereafter.

Accordingly, using the systems and methods described above, control circuity may control a current mode switch mode power supply (e.g., buck converter 100), wherein such control circuitry may detect a peak inductor current $I_{PK}$ of a power inductor of the current mode switch mode power supply and estimate a load current $I_{LOAD\_SS}$ based on the peak inductor current. In addition, the control circuitry may detect, within a main control loop of the current mode switch mode power supply, whether the load current is lower in magnitude than an estimated boundary condition current (e.g., threshold level $I_{ERR\_TH}$), the estimated boundary condition current defining a crossover threshold between operation of the current mode switch mode power supply in a continuous conduction mode and operation of the current mode switch mode power supply in a discontinuous conduction mode. Responsive to the load current being lower in magnitude than the estimated boundary condition current, the control circuitry may cause pulse skipping of an output signal of the current mode switch mode power supply on an immediately subsequent switching cycle of the current mode switch mode power supply.

In addition, the control circuitry may detect occurrences of zero current through a power inductor (e.g., power inductor current $I_L$ through power inductor 110 using zero current detector 107). Responsive to occurrences of zero current through the power inductor being above a predetermined threshold (e.g., the zero crossing threshold), the control circuitry may increase the estimated boundary condition current. Responsive to occurrences of zero current through the power inductor being below the predetermined threshold, the control circuitry may decrease the estimated boundary condition current. In some embodiments, as mentioned above, such predetermined threshold may be one.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for controlling a current mode switch mode power supply, comprising:
   detecting a peak inductor current of a power inductor of the current mode switch mode power supply;
   estimating a load current based on a variable of a main control loop of the current mode switch mode power supply;
   detecting, within a main control loop of the current mode switch mode power supply, whether the load current is lower in magnitude than an estimated boundary condition current threshold, the estimated boundary condition current threshold defining a crossover threshold between operation of the current mode switch mode power supply in a continuous conduction mode and operation of the current mode switch mode power supply in a discontinuous conduction mode; and
   responsive to the load current being lower in magnitude than the estimated boundary condition current, causing pulse skipping of an output signal of the current mode switch mode power supply on an immediately subsequent switching cycle of the current mode switch mode power supply.

2. The method of claim 1, further comprising:
   detecting occurrences of zero current through the power inductor;
   responsive to occurrences of zero current through the power inductor being above a predetermined threshold, increasing the estimated boundary condition current threshold; and
   responsive to occurrences of zero current through the power inductor being below the predetermined threshold, decreasing the estimated boundary condition current threshold.

3. The method of claim 2, wherein the predetermined threshold is one.

4. The method of claim 1, further comprising adaptively adjusting the estimated boundary condition current threshold as a reference for comparison to the load current based on occurrences of zero current through the power inductor.

5. The method of claim 1, wherein the current mode switch mode power supply is a buck converter.

6. A system for controlling a current mode switch mode power supply, comprising:
   a peak detector configured to detect a peak inductor current of a power inductor of the current mode switch mode power supply; and
   control circuitry configured to:
      estimate a load current based on a variable of a main control loop of the current mode switch mode power supply;

detect, within a main control loop of the current mode switch mode power supply, whether the load current is lower in magnitude than an estimated boundary condition current threshold, the estimated boundary condition current threshold defining a crossover threshold between operation of the current mode switch mode power supply in a continuous conduction mode and operation of the current mode switch mode power supply in a discontinuous conduction mode; and responsive to the load current being lower in magnitude than the estimated boundary condition current, cause pulse skipping of an output signal of the current mode switch mode power supply on an immediately subsequent switching cycle of the current mode switch mode power supply.

7. The system of claim 6, further comprising:

a zero current detector configured to detect occurrences of zero current through the power inductor; and wherein the control circuitry is configured to:

responsive to occurrences of zero current through the power inductor being above a predetermined threshold, increase the estimated boundary condition current threshold; and responsive to occurrences of zero current through the power inductor being below the predetermined threshold, decrease the estimated boundary condition current threshold.

8. The system of claim 7, wherein the predetermined threshold is one.

9. The system of claim 6, wherein the control circuitry is further configured to adaptively adjust the estimated boundary condition current threshold as a reference for comparison to the load current based on occurrences of zero current through the power inductor.

10. The system of claim 6, wherein the current mode switch mode power supply is a buck converter.

11. A system comprising:

a signal path for processing a signal;

a current mode switch mode power supply configured to provide a supply voltage to at least one component of the signal path;

a subsystem for controlling the current mode switch mode power supply, comprising:

a peak detector configured to detect a peak inductor current of a power inductor of the current mode switch mode power supply; and control circuitry configured to:

estimate a load current based on a variable of a main control loop of the current mode switch mode power supply;

detect, within a main control loop of the current mode switch mode power supply, whether the load current is lower in magnitude than an estimated boundary condition current threshold, the estimated boundary condition current threshold defining a crossover threshold between operation of the current mode switch mode power supply in a continuous conduction mode and operation of the current mode switch mode power supply in a discontinuous conduction mode; and responsive to the load current being lower in magnitude than the estimated boundary condition current, cause pulse skipping of an output signal of the current mode switch mode power supply on an immediately subsequent switching cycle of the current mode switch mode power supply.

12. The system of claim 11, the subsystem further comprising:

a zero current detector configured to detect occurrences of zero current through the power inductor; and wherein the control circuitry is configured to:

responsive to occurrences of zero current through the power inductor being above a predetermined threshold, increase the estimated boundary condition current threshold; and responsive to occurrences of zero current through the power inductor being below the predetermined threshold, decrease the estimated boundary condition current threshold.

13. The system of claim 12, wherein the predetermined threshold is one.

14. The system of claim 11, wherein the control circuitry is further configured to adaptively adjust the estimated boundary condition current threshold as a reference for comparison to the load current based on occurrences of zero current through the power inductor.

15. The system of claim 11, wherein the current mode switch mode power supply is a buck converter.

16. The system of claim 11, wherein the variable of the main control loop is the peak inductor current.

17. The method of claim 1, wherein the variable of the main control loop is the peak inductor current.

18. The system of claim 6, wherein the variable of the main control loop is the peak inductor current.

* * * * *

UNITED STATES PATENT AND TRADEMARK OFFICE
CERTIFICATE OF CORRECTION

PATENT NO. : 10,715,039 B1
APPLICATION NO. : 16/294581
DATED : July 14, 2020
INVENTOR(S) : Ilango et al.

It is certified that error appears in the above-identified patent and that said Letters Patent is hereby corrected as shown below:

In the Specification

1. In Column 5, Lines 64-65, delete "$I_{ERR\_TH} = \frac{V_{BAT} - V_{SUPPLY}}{SLF_{sw}} D$" and insert -- $I_{ERR\_TH} = \frac{V_{BAT} - V_{SUPPLY}}{SLF_{sw}} D$ --, therefor.

2. In Column 6, Line 12, delete "performance To" and insert -- performance. To --, therefor.

3. In Column 6, Line 49, delete "$I_{ERR-TH}$" and insert -- $I_{ERR\_TH}$ --, therefor.

Signed and Sealed this
Fourth Day of October, 2022

Katherine Kelly Vidal
*Director of the United States Patent and Trademark Office*